(12) United States Patent
Gatterbauer

(10) Patent No.: US 8,736,062 B2
(45) Date of Patent: May 27, 2014

(54) PAD SIDEWALL SPACERS AND METHOD OF MAKING PAD SIDEWALL SPACERS

(75) Inventor: Johann Gatterbauer, Parsberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/587,816

(22) Filed: Aug. 16, 2012

(65) Prior Publication Data

US 2014/0048958 A1   Feb. 20, 2014

(51) Int. Cl.
  *H01L 23/40*  (2006.01)
  *H01L 23/48*  (2006.01)
  *H01L 23/52*  (2006.01)

(52) U.S. Cl.
  USPC .... 257/773; 257/778; 257/784; 257/E21.503; 257/E21.508; 257/E23.02; 257/E23.021; 438/612; 438/613; 438/617

(58) Field of Classification Search
  USPC .......... 257/773, 778, 784, E21.503, E21.508, 257/E23.02, E23.021; 438/612, 613, 617
  See application file for complete search history.

(56) References Cited

U.S. PATENT DOCUMENTS

| 6,124,637 | A  | * | 9/2000 | Freyman et al. | 257/736 |
| 2006/0166402 | A1 | * | 7/2006 | Lim et al. | 438/108 |
| 2009/0258486 | A1 | * | 10/2009 | Watanabe | 438/613 |
| 2012/0145668 | A1 | * | 6/2012 | Riege | 216/41 |

FOREIGN PATENT DOCUMENTS

DE  102007002156 A1  7/2008

* cited by examiner

*Primary Examiner* — Asok K Sarkar
(74) *Attorney, Agent, or Firm* — Slater & Matsil, L.L.P.

(57) ABSTRACT

A method of making contact pad sidewall spacer and pad sidewall spacers are disclosed. An embodiment includes forming a plurality of contact pads on a substrate, each contact pad having sidewalls, forming a first photoresist over the substrate, and removing the first photoresist from the substrate thereby forming sidewall spacers along the sidewalls of the plurality of the contact pads.

23 Claims, 6 Drawing Sheets

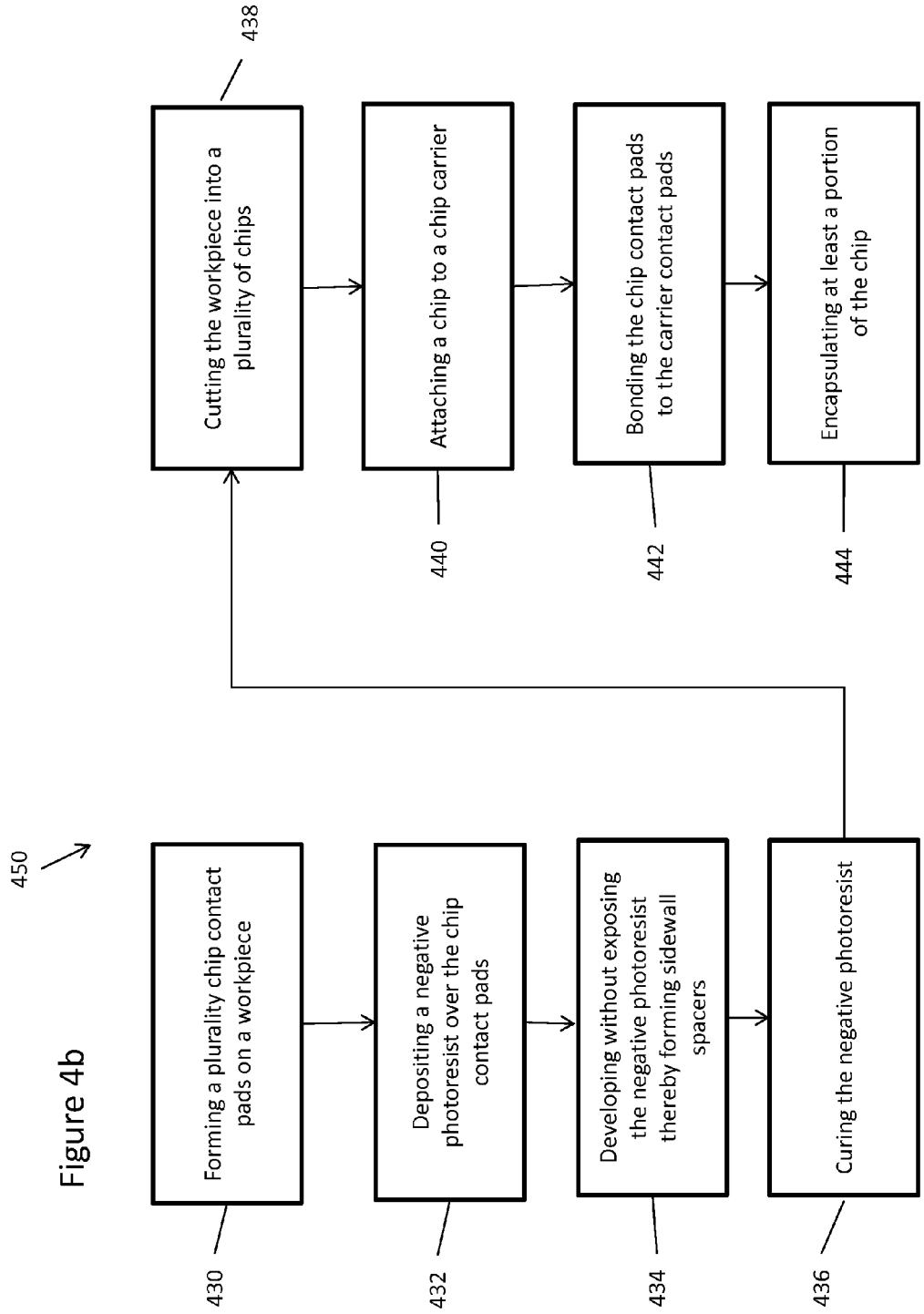

PAD SIDEWALL SPACERS AND METHOD OF MAKING PAD SIDEWALL SPACERS

TECHNICAL FIELD

The present invention relates generally to a semiconductor device and a method of making a semiconductor device. In particular, embodiments of the invention relate to chip contact pads having sidewall spacers and a method of making chip contact pads having sidewall spacers.

BACKGROUND

Power semiconductor devices are semiconductor devices used as switches or rectifiers in power electronic circuits.

The realm of power devices is divided into two main categories: The two-terminal devices (diodes), whose state is completely dependent on the external power circuit they are connected to; and the three-terminal devices, whose state is not only dependent on their external power circuit, but also on the signal on their driving terminal (gate or base). Transistors and thyristors belong to that category.

A second classification is less obvious, but has a strong influence on device performance: Some devices are majority carrier devices such as Schottky diode and MOSFET, while the others are minority carrier devices such as Thyristor, bipolar transistor, and IGBT. The former use only one type of charge carriers, while the latter use both (i.e. electrons and holes). The majority carrier devices are faster, but the charge injection of minority carrier devices allows for better On-state performance.

SUMMARY OF THE INVENTION

In accordance with an embodiment of the present invention, a method of making a semiconductor device comprises forming a plurality of contact pads on a substrate, each contact pad having sidewalls, forming a first photoresist over the substrate, and removing the first photoresist from the substrate thereby forming sidewall spacers along the sidewalls of the plurality of the contact pads.

In accordance with another embodiment of the present invention, a method of making a semiconductor device comprises forming a plurality of chip contact pads on a workpiece, each chip contact pad having sidewalls, forming first photoresist spacers along the sidewalls of the plurality of chip contact pads, and forming a plurality of chips by cutting the workpiece, each chip having a chip contact pad. The method further comprises placing a chip of the plurality of the chips on a carrier, bonding the chip contact pad to a carrier contact pad of the carrier, and encapsulating the chip contact pad with an encapsulation material.

In accordance with yet another embodiment of the present invention, a semiconductor device comprises a carrier having a carrier contact pad and a chip disposed on the carrier, the chip having a chip contact pad and first photoresist sidewall spacers along sidewalls of the chip contact pad. The semiconductor device further comprises a connection element connecting the chip contact pad with the carrier contact pad and an encapsulation material encapsulating at least a portion of the chip.

BRIEF DESCRIPTION OF THE DRAWINGS

For a more complete understanding of the present invention, and the advantages thereof, reference is now made to the following descriptions taken in conjunction with the accompanying drawings, in which:

FIG. 4b illustrates a flowchart of an embodiment of a method of manufacturing a semiconductor device.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely photoresist sidewall spacers of power contact pads. The invention may also be applied, however, to other type of sidewall spacers of other contact elements.

Figure 1:
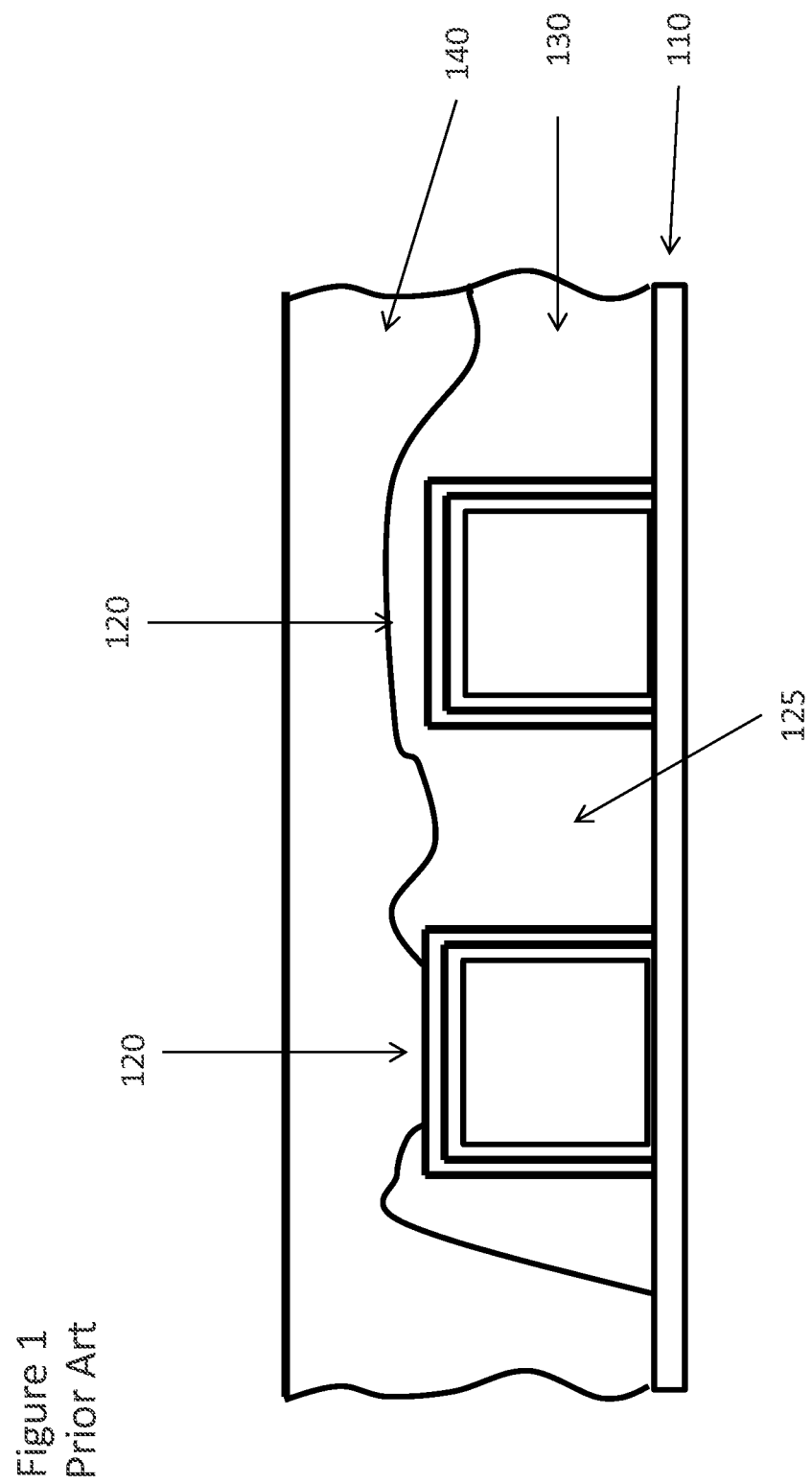
FIG. 1 illustrates conventional power contact pads.

FIG. 1 shows conventional power contact pads 120. The conventional power contact pads 120 are encapsulated in a mold compound 140. A problem with the conventional power contact pads 120 is that the mold compound does not properly adhere to the passivation layer 110 and the sidewalls of the chip contact pads. A further problem with the conventional power contact pads 120 is that the amount of polyimide 130 around power contact pads creates a substantial amount of stress and a substantial amount of wafer bow. Finally, a problem with the conventional power contact pads 120 is that the coarse particles of the mold compound do not properly fill the small space 125 between adjacent power contacts 120.

Therefore, a packaged power semiconductor device is needed in the art in which sidewall spacers provide proper adhesion to the passivation layer and the sidewalls of the chip contact pads. Moreover, a packaged power semiconductor device is needed that provides proper dielectric strength (electrical potential required to break down the insulator per unit thickness) between adjacent chip contact pads.

An embodiment of the invention provides a chip contact pad having photoresist sidewall spacers. A further embodiment of the invention provides sidewall spacers along a lower portion of the sidewalls but not along an upper portion of the sidewalls. Yet another embodiment of the invention provides sidewall spacers on sidewalls of closely spaced chip contact pads facing each other, wherein the majority of the space between the chip contact pads is filled with a molding compound.

An embodiment of the invention provides a method of forming photoresist sidewall spacers along chip contact pads by depositing a positive photoresist over chip contact pads and exposing the positive photoresist with a defocused light. A further embodiment of the invention provides a method of forming photoresist sidewall spacers along chip contact pads by depositing a negative photoresist over chip contact pads and partially developing the negative photoresist without exposing the negative photoresist.

An advantage is that sidewall spacers of the chip contact pads can be formed by exposing a photoresist without a lithography mask. A further advantage is that the dielectric strength is increased between the two closely spaced sidewall spacers and that the leakage current is reduced. A final advantage is that the wafer bow is reduced because of the limited amount of photoresist.

Figure 2A:
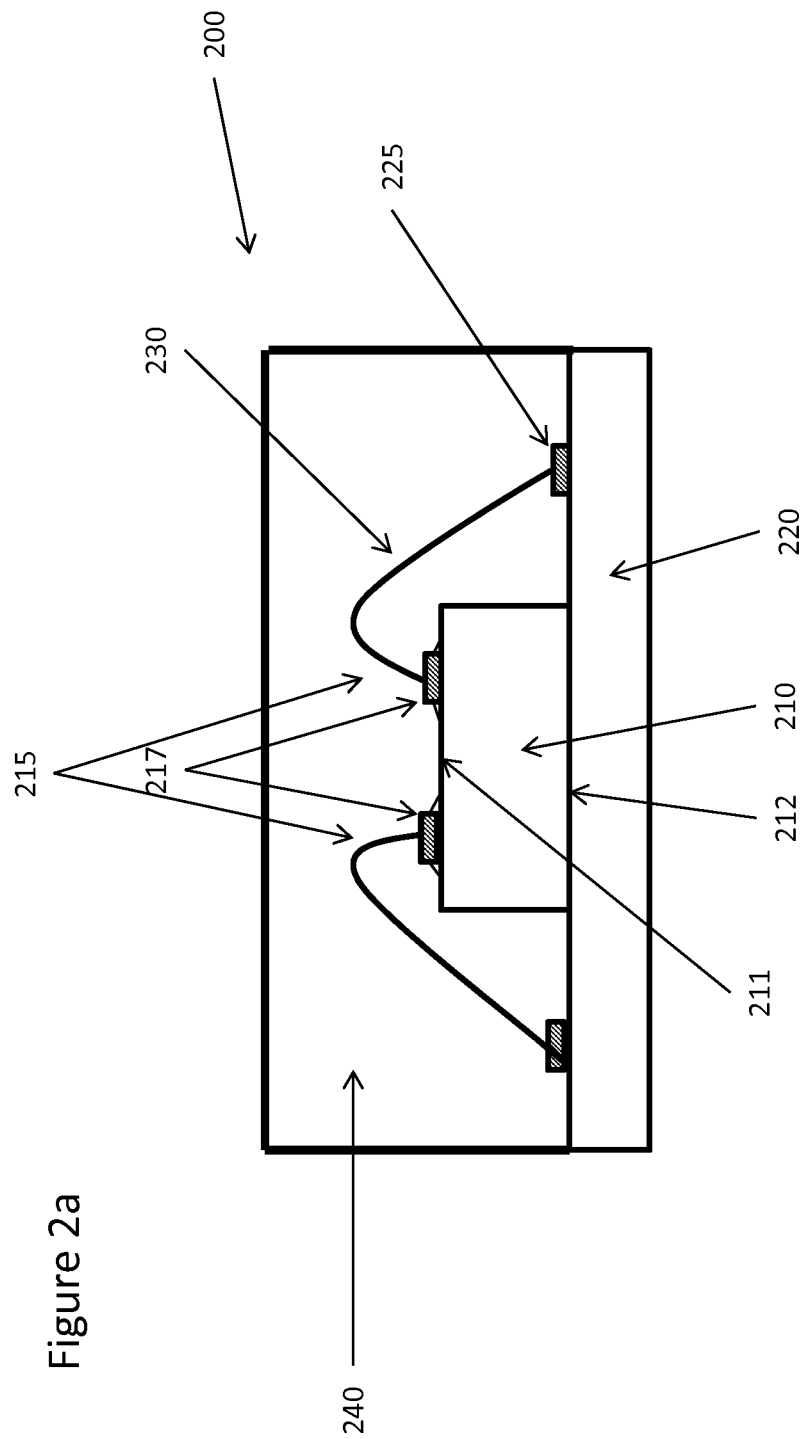
FIG. 2a illustrates an embodiment of a packaged semiconductor device having sidewalls on chip contact pads.

FIG. 2a shows an embodiment of a packaged power semiconductor device 200. A chip 210 is disposed on a carrier 220. The chip 210 has a first main surface 211 and a second main surface 212. Chip contact pads 215 are disposed on the first main surface 211. Sidewall spacers 217 are arranged on sidewalls of the chip contact pads 215. The chip contact pads 215 are electrically connected to carrier contact pads 225 via bondwires 230. The chip 210 is encapsulated with a molding compound 240.

The chip 210 comprises a semiconductor substrate. The semiconductor substrate may be a single crystal substrate such as silicon or germanium, or a compound substrate such as SiGe, GaAs, InP or SiC. One or more interconnect metallization layers may be arranged on the semiconductor substrate. A passivation layer is disposed on the top surface of the metallization layers in order to seal the chip. The passivation layer may comprise SiN, for example. The top surface of the chip is the first main surface 211. The bottom of the semiconductor substrate is the second main surface 212 of the chip. Chip contact pads 215 are disposed on the top surface 211 of the chip 210.

The chip 210 may comprise an integrated circuit (IC) or a discrete device such as a single semiconductor device. For example, the chip 210 may comprise a power semiconductor device such as a bipolar transistor, an insulated gate bipolar transistor (IGBT), a power MOSFET, a thyristor or a diode.

The carrier 220 may comprise a substrate, a lead frame or a printed circuit board (PCB). The carrier 220 may comprise carrier contact pads 225. The carrier contact pads 225 comprise a conductive material such as a metal. For example, the carrier contact pads 225 comprise copper and/or nickel.

The chip 210 is attached to the carrier 220. For example, the second main surface 212 of the chip 210 is bonded or glued to the top surface of the carrier 220 with an adhesive tape. Alternatively, the second main surface 212 of the chip 210 is bonded or glued to the top surface of the carrier 220 using an electrically insulating adhesive such as a resin.

The chip contact pads 215 are electrically connected to the carrier contact pads 225 via wirebonds 230. The wirebonds 230 may comprise copper (Cu), gold (Au) or aluminum (Al). The wirebonds 230 may be connected to the chip contact pads 215 and/or carrier contact pads 225 via a ball bonding process or a wedge bonding process. Embodiments of the chip contact pads 215 are discussed with respect to FIG. 3 below.

A molding compound 240 encapsulates the chip 210 and overlies the top surface of the carrier 220. The molding compound 240 may comprise a thermoset material or a thermoplastic material. The molding compound may comprise coarse grained material particles.

In one embodiment, the chip 210 may be attached to a heat sink (not shown). The heat sink may be arranged between the chip 210 and the carrier 220. In one embodiment the carrier 220 may comprise the heat sink. Packaging and heat sinks provide a way for removing heat from the chip 210 by conducting it to the external environment. Generally, large current devices have large die and packaging surface areas and low thermal resistance.

Figure 2B:
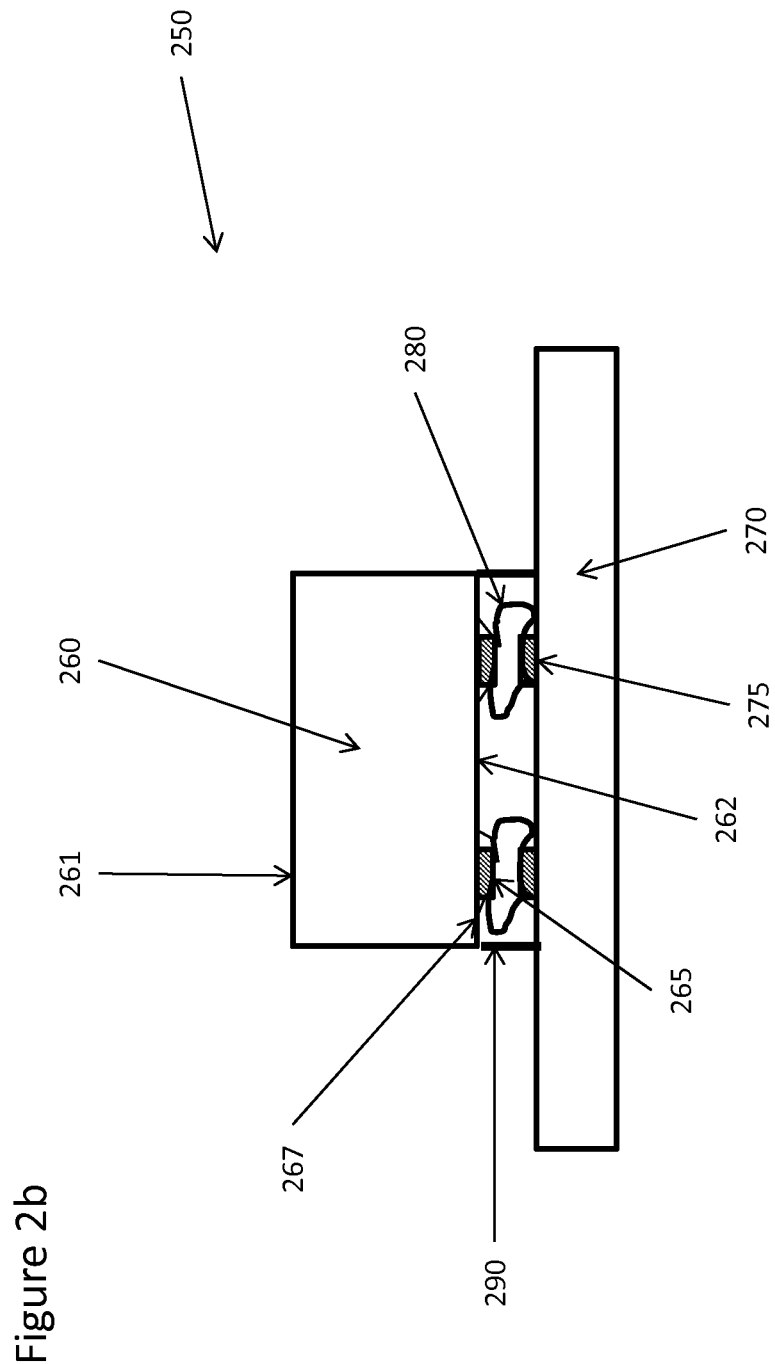
FIG. 2b illustrates a further embodiment of a packaged semiconductor device having sidewalls on chip contact pads.

FIG. 2b shows another embodiment of a packaged power semiconductor device 250. A chip 260 is disposed on a carrier 270. The chip 260 has a first main surface 261 and a second main surface 262. Chip contact pads 265 are arranged on the first main surface 261. Sidewall spacers 267 are disposed on sidewalls of the chip contact pads 265. The chip contact pads 265 are electrically connected to carrier contact pads 275 via solder balls 280. The chip 260 is encapsulated with a molding compound 290.

The embodiment of FIG. 2b may comprise similar or same materials and elements as described with respect to FIG. 2a except for the electrical connection between the chip 260 and the carrier 270. In the embodiment of FIG. 2b the chip 260 is electrically connected to the carrier 270 using solder bumps. Alternatively, gold bumps, molded studs or electrically conductive polymers can be used. The chip 260 is placed on the carrier 270 in a flip chip arrangement so that the first main surface 261 faces the top surface of the carrier 270 and the second main surface 262 faces away from the carrier top surface. The solder bumps may be lead based or lead less solder bumps.

Figure 3:
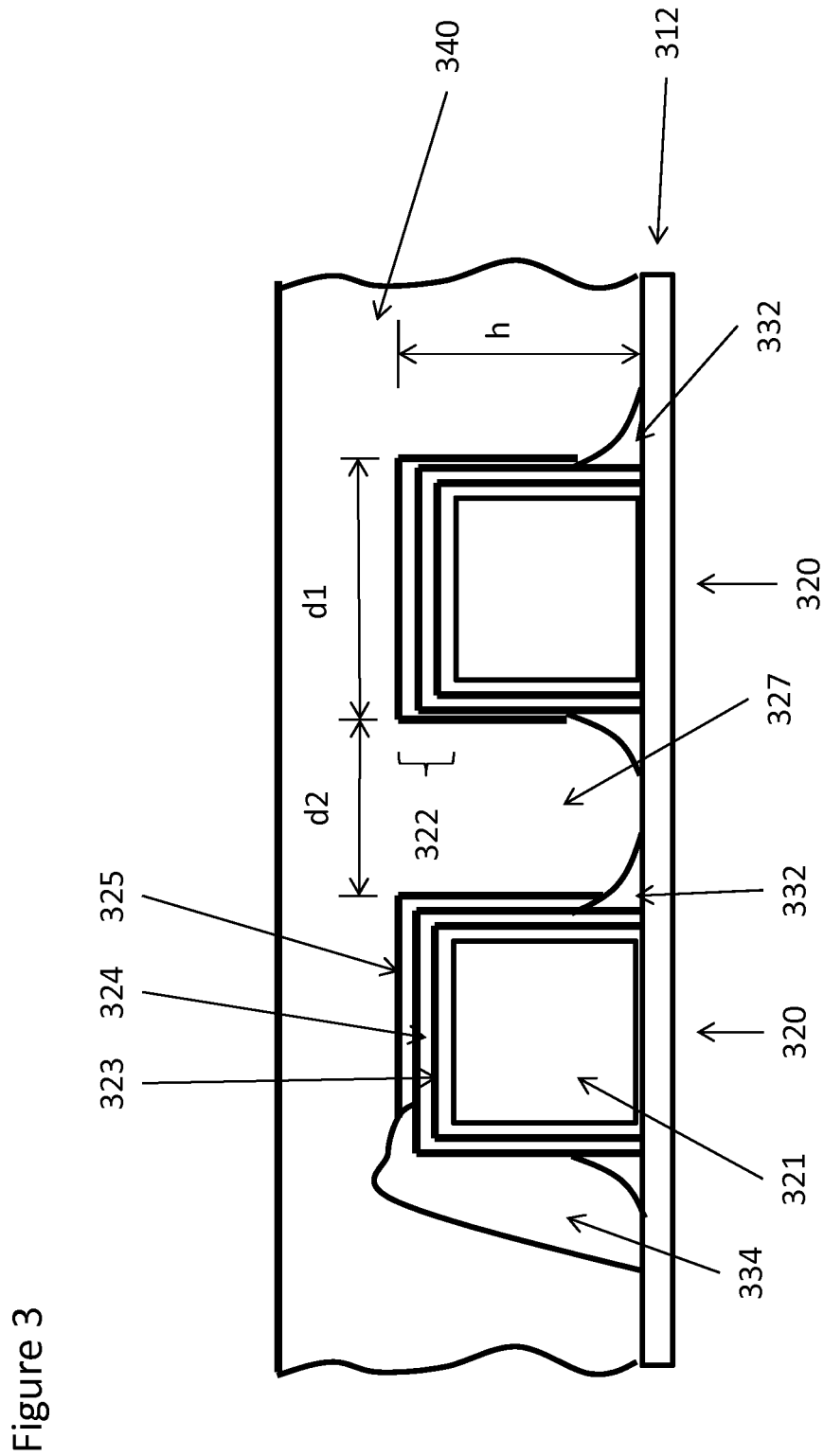
FIG. 3 illustrates an embodiment of a detailed view of a portion of the top surface of a chip.

FIG. 3 shows an embodiment of a detailed view of a portion of the top surface 211 of the chip 210 of the embodiments of FIGS. 2a and 2b. Chip contact pads 320 are disposed on a passivation layer 312. The chip contact pads 320 may be electrically connected to a top metal of the interconnect metallization layer stack thorough a contact via. The chip contact pads 320 may be made from a metal. For example, the chip contact pads 320 may comprise a copper (Cu) layer 321. Alternatively, the chip contact pads 320 may comprise a copper alloy layer 321 including a predetermined proportion of Cr, Al, Si, Ti, Fe, Ag and/or P.

The chip contact pads 320 further comprises a metallic material layer stack 322. The metallic material layer stack 322 may encapsulate the copper layer or copper alloy layer 321. The metallic material layer stack 322 may comprise at least one metallic materials. A second layer 324 of the metallic material layer stack 322 may be an optional palladium (Pd) layer or an optional palladium alloy layer. A third layer 325 of the metallic material layer stack 322 may be an optional gold (Au) layer or an optional gold alloy layer. The metallic material layer stack 322 may comprise more than three metal layers.

The chip contact pad may comprise a width $d_1$ of about 20 μm to about 500 μm, and a height h of about 1 μm to about 50 μm. Alternatively, the height h may be about 6 μm to about 20 μm. The width $d_1$ is measured from the left sidewall of the uppermost metal layer of the chip contact pad to the right sidewall of the uppermost metal layer of the chip contact pad. The height $d_2$ of the chip contact pad is measured from the top surface of the passivation layer to the top surface of the chip contact pad.

Sidewall spacers 332 may be disposed along a first 323, a second 324 or a third 325 metal layer of the metallic material layer stack 322. The sidewall spacers 332 may be disposed on a lower portion of the chip contact pad 320 but not on an upper portion of the chip contact pad 320. For example, the sidewall spacers 332 are disposed in the lower 30% of the height h or in the lower 50% of the height h. The sidewall spacers 332 may comprise an insulator material. The insulator material may comprise a higher dielectric strength than the molding compound 340 (discussed below). The insulator material may be a positive photoresist, a negative photoresist, a polyimide, or a PBO (Poly-Benz-Oxazole). In one embodiment the sidewall spacers 332 are located directly adjacent the optional palladium layer 324 (and if there is no palladium layer 324 directly adjacent to the nickel layer 323). The gold layer 325 may overly only a portion of the chip contact pad 320, e.g., the portion other than the portions covered by the sidewall spacers 332.

In one embodiment two chip contact pads 320 may be located adjacent to each other and separated from each other by a small width $d_2$ forming a space 327. The sidewall spacers 332 may or may not overlie the entire width $d_2$ along the passivation layer 312 between the two chip contact pads 320. Alternatively, the passivation layer 312 does not overlie the entire width $d_2$ and is not exposed to the molding compound 340 in a center portion of the width $d_2$.

Second sidewall spacers 334 may be disposed over the first sidewall spacers 332 and along the sidewalls of the chip contact pads 320. The second sidewall spacers 334 may be disposed along the sidewalls including an upper portion of the sidewalls. The second sidewall spacers 334 may comprise an insulator material. The insulator material may comprise a higher dielectric strength than the molding compound 340 (discussed below). The insulator material may be a positive photoresist, a negative photoresist, a polyimide, or a PBO (Poly-Benz-Oxazole). In one embodiment the sidewall spacers 334 are located directly adjacent the optional palladium layer 324 (and if there is no palladium layer 324 directly adjacent the nickel layer 323). The gold layer 325 may overly only a portion of the chip contact pad, e.g., the portions other than the portion covered by the first and second sidewall spacers 332/334. The second sidewall spacers 334 may comprise the same material as the first sidewall spacers 332.

The second sidewall spacers 334 may only be disposed along the outer sidewalls of the chip contact pads 320, e.g., the sidewalls which do not face the space 327. The second sidewall spacers 334 may comprise a higher topology than the chip contact pads.

A molding compound 340 surrounds the contact chip pads 320 and the first and second sidewall spacers 332/334. The molding compound 340 may fill the majority of the space 327 between the closely spaced contact chip pads 320. The molding compound 340 may fill a center portion of the space 327 between the closely spaced contact chip pads 320 and may be in direct contact with a top surface of a portion of the passivation layer 312.

Figure 4A:
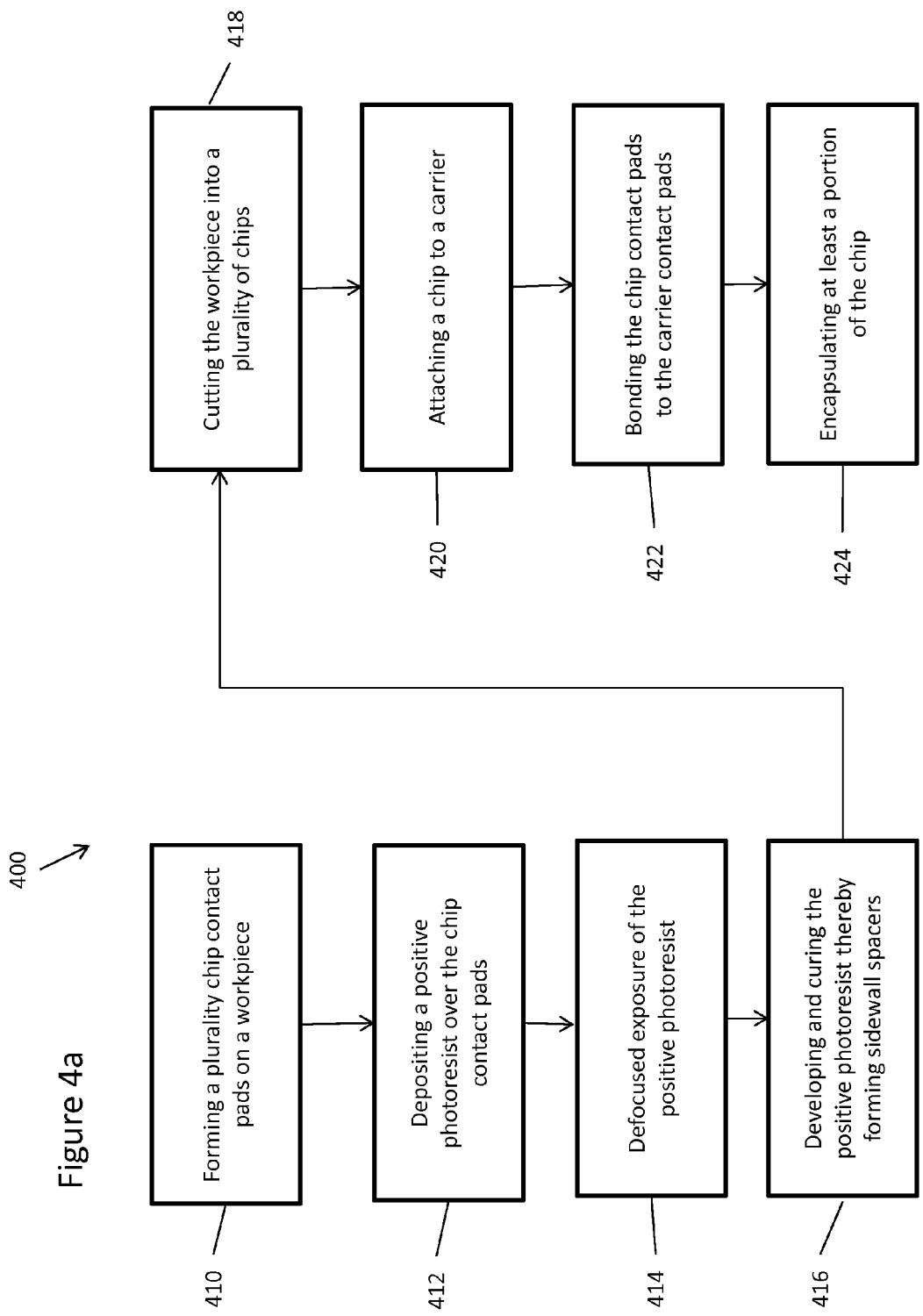
FIG. 4a illustrates a flowchart of an embodiment of a method of making a semiconductor device.

FIG. 4a shows a flowchart 400 of an embodiment of a method of manufacturing a semiconductor device having chip contact pads with sidewall spacers. In a first step 410 a plurality of chip contact pads are formed on a workpiece. The workpiece may be a wafer, a substrate or a printed circuit board (PCB). In one embodiment the substrate may comprise a semiconductor material or a compound material and one or more interconnect metallization layers disposed thereon. A passivation layer is disposed over the interconnect metallization layers and the chip contact pads are disposed on the passivation layer. The chip contact pads are connected through a contact via to the most upper metal layer of the interconnect metallization layers. In another embodiment the substrate may comprise conducting layers made of thin metal foil embedded in insulating layers laminated together with epoxy resin prepreg for example.

In an embodiment a copper layer or a copper alloy layer is masked on the passivation layer. For example, the copper or copper alloy layer is formed by first forming a seed layer and then depositing copper/copper alloy in an electro-less plating process. The chip contact pads may further include a metallic material layer stack. The metallic material layer stack may also be formed by electro-less plating process. The metallic material layer stack may comprise a nickel (Ni) layer or a nickel alloy layer. The metallic layer stack may further comprise an optional palladium (Pd) or an optional palladium alloy layer. Finally, the metallic layer stack may comprise an optional gold or an optional gold alloy layer. In one embodiment the gold or gold alloy layer may be formed after the first and optionally second sidewall spacers are formed. Alternatively, the chip contact pads may be formed by other deposition processes such as electro chemical plating or physical vapor deposition (PVD).

Next, at 412, the chip contact pads are coated with a first photoresist. The first photoresist may be a positive photoresist. The positive photoresist may be disposed or spun over the chip contact pads. A positive photoresist is a type of photoresist in which the portion of the photoresist that is exposed to light becomes soluble to the developer. The positive photoresist may be a polyimide or a PBO.

The positive photoresist is exposed with defocused light (step 414). For example, the positive photoresist is exposed so that the lower portions along the sidewalls of the chip contact pads and the bottom portion are not exposed to light. The exposure light may be focused at a distance away from the top surface of the passivation layer. For example, the exposure light is focused at the height h at the level of the top surface of the chip contact pads. The positive photoresist may be exposed to light without using a photo lithography mask or alternatively, with a dummy lithography mask which does not have any structures. The positive photoresist is then developed and cured (step 416). In one embodiment the sidewall spacers are formed on a lower portion of the sidewalls of the chip contact pads but not on an upper portion of the sidewalls. For example, the sidewall spacers may be placed in a region on the sidewalls which is below half of the height h of a sidewall of the chip contact pad.

In an optional step, the first sidewall spacers and the chip contact pads are coated with an optional second photoresist. The second photoresist may be disposed or spun over the chip contact pads and the first sidewall spacers. The second photoresist may be a positive photoresist or a negative photoresist. The second photoresist is similarly treated as the first photoresist if it is a positive photoresist or is similarly treated as the negative photoresist described further below. The second photoresist may be structured via a lithography mask. The second photoresist may be the same as or different than the first photoresist. The first and second sidewall spacers advantageously prevent a corrosive attack on the copper or copper alloy layer and/or the nickel or nickel alloy layer.

In the next step 418 the workpiece is singulated or cut into a plurality of chips or dies. Each chip comprises at least one chip contact pad including the first positive photoresist sidewall spacers and optionally the second sidewall spacers.

In the next step 420, a chip of the plurality of chips is placed on a carrier such as a semiconductor substrate, a lead frame or a printed circuit board (PCB). The chips may be attached to the carrier by gluing or soldering. For example, the chip may be attached to the carrier applying an adhesive tape. In one embodiment the chip is bonded to the carrier with the chip contact pads facing away from the carrier. In another embodiment the chip is bonded to the carrier with the chip contact pads facing toward the carrier.

Then, the chip contact pads may be bonded to the carrier contact pads of the carrier (step 422). For example, the chip contact pads of the chip are wire bonded to the carrier contact pads of the carrier. Alternatively, the chip contact pads of the chip are soldered to carrier contact pads of the carrier. In one embodiment, the chip contact pads of the chip may not comprise the optional palladium layer when a copper wire is bonded and may comprise the optional palladium layer when the aluminum wire is bonded. A gold wire can be bonded with or without the optional palladium layer.

Finally, at step 424, the chip is encapsulated with an encapsulation material. The encapsulation material may be a molding compound. The molding compound may comprise a thermoset material or a thermoplastic material. The molding compound may include a coarse grained material.

FIG. 4b shows a flowchart 450 of an embodiment of a method of manufacturing a semiconductor device having chip contact pads with sidewall spacers. In a first step 430, a plurality of chip contact pads are formed on a workpiece. The workpiece may be a wafer, a substrate or a printed circuit board (PCB). In one embodiment the substrate may comprise a semiconductor material or a compound material and one or more interconnect metallization layers disposed thereon. A passivation layer is disposed over the interconnect metallization layers and the chip contact pads are disposed on the passivation layer. The chip contact pads are connected through a contact via to the most upper metal layer of the interconnect metallization layers. In another embodiment the substrate may comprise conducting layers made of thin metal foil embedded in insulating layers laminated together with epoxy resin prepreg for example.

In an embodiment a copper layer or a copper alloy layer is masked on the passivation layer. For example, the copper or copper alloy layer is formed by first forming a seed layer and then depositing copper/copper alloy in an electro-less plating process. The chip contact pads may further include a metallic material layer stack. The metallic material layer stack may also be formed by electro-less plating process. The metallic material layer stack may comprise a nickel (Ni) layer or a nickel alloy layer. The metallic layer stack may further comprise an optional palladium (Pd) layer or an optional palladium alloy layer. Finally, the metallic layer stack may comprise an optional gold or an optional gold alloy layer. Alternatively, the chip contact pads may be formed by other deposition processes such as electro chemical plating or physical vapor deposition (PVD).

Next, at 432, the chip contact pads are coated with a first photoresist. The first photoresist may be a negative photoresist. The negative photoresist may be disposed or spun over the chip contact pads. A negative photoresist is a type of photoresist in which the portion of the photoresist that is exposed to light becomes insoluble to the developer. The negative photoresist may be a polyimide.

The negative photoresist is developed without exposing the negative photoresist to light (step 434). The negative photoresist is not completely developed. For example, the negative photoresist is only developed above the height h. Alternatively the negative photoresist is developed above 30% or above 50% of the height h. The negative photoresist is then cured (step 436). In one embodiment the sidewall spacers are formed on a lower portion of the sidewalls of the chip contact pads but not on an upper portion of the sidewalls. For example, the sidewall spacers may be placed in a region on the sidewalls which is below 50% of the height h or below 30% of the height h.

In an optional step, the chip contact pads and the first sidewall spacers are coated with an optional second photoresist. The second photoresist may be disposed or spun over the chip contact pads and the first sidewall spacers. The second photoresist may be a positive photoresist or a negative photoresist. The second photoresist is similarly treated as the first photoresist described in the embodiment of FIG. 4a if it is a positive photoresist or is similarly treated as the negative photoresist described in this embodiment. The second photoresist may be the same as or different than the first photoresist. The first and second sidewall spacers advantageously prevent a corrosive attack on the copper or copper alloy layer and/or the nickel or nickel alloy layer.

In the next step 438 the workpiece is singulated or cut into a plurality of chips or dies. Each chip comprises at least one chip contact pad including the first negative photoresist sidewall spacers and the optional second sidewall spacers.

In the next step 440 a chip of the plurality of chips is placed on a carrier such as a semiconductor substrate, a lead frame or a printed circuit board (PCB). The chips may be attached to the carrier by gluing or soldering. For example, the chip may be attached to the carrier applying an adhesive tape. In one embodiment the chip is bonded to the carrier with the chip contact pads facing away from the carrier. In another embodiment the chip is bonded to the carrier with the chip contact pads facing toward the carrier.

Then, the chip contact pads may be bonded to the carrier contact pads of the carrier (step 442). For example, the chip contact pads of the chip are wire bonded or soldered to the carrier contact pads of the carrier. In one embodiment, the chip contact pads of the chip may not comprise the optional palladium layer when a copper or gold wire is bonded and may comprise the optional palladium layer when the aluminum wire is bonded.

Finally, at step 444, the chip is encapsulated with an encapsulation material. The encapsulation material may be a molding compound. The molding compound may comprise a thermoset material or a thermoplastic material. The molding compound may comprise a coarse grained material.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of making a semiconductor device, the method comprising:
   forming two contact pads adjacent to each other on a substrate, wherein each contact pad has sidewalls, and wherein each sidewall has a height;
   forming a first photoresist over the substrate; and
   removing a portion of the first photoresist from the substrate thereby forming sidewall spacers along the sidewalls of the two contact pads, wherein the sidewall spacers between the two contact pads are disposed only along a lower portion of the height.

2. The method according to claim 1, wherein forming the first photoresist comprises forming a positive photoresist.

3. The method according to claim 2, wherein removing the portion of the first photoresist comprises exposing the positive photoresist with defocussed light and developing the positive photoresist.

4. The method according to claim 1, wherein forming the first photoresist comprises forming a negative photoresist.

5. The method according to claim 4, wherein removing the portion of the first photoresist comprises developing the negative photoresist without exposing the portion of the negative photoresist.

6. The method according to claim 1, wherein the two contact pads are separated by a line width, the method further comprising forming a second photoresist only along sidewalls of the two contact pads facing away from the line width.

7. The method according to claim 1, wherein forming the two contact pads comprises forming copper or copper alloy contact pads and forming a metallic material layer stack on the copper or copper alloy contact pads, the metallic material layer stack comprises a nickel (Ni) based layer.

8. A semiconductor device comprising:
a carrier having carrier contact pads;
a chip disposed on the carrier, the chip having two chip contact pads adjacent to each other, wherein each chip contact pad comprises sidewalls, wherein each sidewall comprises a height, and wherein first photoresist sidewall spacers between the two contact pads are disposed only along a lower portion of the height;
a connection element connecting the chip contact pads with the carrier contact pads; and
an encapsulation material encapsulating at least a portion of the chip.

9. The semiconductor device according to claim 8, further comprising second photoresist sidewall spacers disposed over first photoresist sidewall spacers facing away from the adjacent chip contact pad.

10. The semiconductor device according to claim 9, wherein the first photoresist sidewall spacers comprise a first polyimide and wherein the second photoresist sidewall spacers comprise a second polyimide.

11. The semiconductor device according to claim 10, wherein the first polyimide is the same as the second polyimide.

12. The semiconductor device according to claim 9, wherein the first photoresist sidewall spacers comprise a first PBO (Poly-Benz-Oxazole) and wherein the second photoresist sidewall spacers comprise a second PBO.

13. The semiconductor device according to claim 12, wherein the first PBO is the same as the second PBO.

14. The semiconductor device according to claim 8, wherein the connection element comprises a wire.

15. The semiconductor device according to claim 8, wherein the chip is a power semiconductor chip.

16. A method of making a semiconductor device, the method comprises:
forming two chip contact pads adjacent to each other on a chip, each chip contact pad having sidewalls;
forming first photoresist spacers along the sidewalls of the two chip contact pads;
forming second photoresist spacers only along sidewalls of the two contact pads facing away from each other;
placing the chip on a carrier;
bonding the chip contact pads to carrier contact pads; and
encapsulating the chip contact pads with an encapsulation material.

17. The method according to claim 16, wherein forming the first photoresist spacers comprises forming first positive photoresist spacers.

18. The method according to claim 17, wherein forming the first positive photoresist spacers comprises:
disposing the positive photoresist on the chip;
exposing the positive photoresist with defocussed light;
developing the positive photoresist; and
curing the positive photoresist.

19. The method according to claim 16, wherein forming the first photoresist spacers comprises forming first negative photoresist spacers.

20. The method according to claim 19, wherein forming the first negative photoresist spacers comprises:
disposing a negative photoresist on the chip;
removing portions of the negative photoresist by developing the portions of the negative photoresist without exposing the negative photoresist; and
curing the negative photoresist.

21. The method according to claim 16, wherein the first photoresist spacers and the second spacers comprise the same material.

22. The method according to claim 16, wherein forming the two chip contact pads comprises forming copper or copper alloy chip contact pads and forming a metallic material layer stack on the copper or copper alloy chip contact pads, the metallic material layer stack comprises a nickel (Ni) based layer and a gold (Au) layer.

23. A method of making a semiconductor device, the method comprising:
forming two contact pads adjacent to each other on a substrate, each contact pad having sidewalls;
forming a first photoresist over the substrate; and
removing a portion of the first photoresist from the substrate thereby forming sidewall spacers along the sidewalls of the two contact pads, the substrate between the two contact pads being covered with the sidewall spacers.

* * * * *